US007755412B2

(12) United States Patent
Thoma

(10) Patent No.: US 7,755,412 B2
(45) Date of Patent: Jul. 13, 2010

(54) BI-DIRECTIONAL LEVEL SHIFTED INTERRUPT CONTROL

(75) Inventor: Jeffrey M. Thoma, San Diego, CA (US)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 12/060,561

(22) Filed: Apr. 1, 2008

(65) Prior Publication Data

US 2009/0243695 A1    Oct. 1, 2009

(51) Int. Cl.
*H03L 5/00*    (2006.01)
(52) U.S. Cl. .......................... 327/333; 326/30; 710/110
(58) Field of Classification Search ................. 327/333; 326/30; 710/110
See application file for complete search history.

(56) References Cited

U.S. PATENT DOCUMENTS

| 5,790,526 | A |   | 8/1998 | Kniess et al. |
| 5,877,633 | A | * | 3/1999 | Ng et al. ........................ 326/80 |
| 6,212,586 | B1 | * | 4/2001 | Mros et al. ................... 710/302 |
| 6,674,318 | B2 | * | 1/2004 | Kanda et al. ................. 327/540 |
| 6,941,483 | B2 | * | 9/2005 | Brown et al. ................. 713/500 |
| 7,098,721 | B2 | * | 8/2006 | Ouellette et al. ............. 327/525 |
| 7,202,727 | B2 |   | 4/2007 | Lee et al. |

OTHER PUBLICATIONS

Herman Schutte, Bi-directional level shifter for I²C-bus and other systems, AN97055 Philips Semiconductors, Apr. 4, 1997, http://wwwasic.kip.uni-heidelberg.de/lhcb/Publications/external/AN97055.pdf.
Susanne Nell, Harry Bissell, Keith Szolusha, Bill Stutz, VM Holla, Peter Liu, Design Ideas, Dec. 26, 2002, http://www.edn.com/index.asplayout=ednPDF&file_name=/contents/images/122602di.pdf.

* cited by examiner

*Primary Examiner*—Kenneth B. Wells

(57) ABSTRACT

The present example provides a circuit offering interoperability between circuits that may be powered from differing voltages, and that may operate at differing logic levels. Isolation may be provided from the impedance provided by transistor circuits and level shifting may be provided by a divider network. Accordingly, an exemplary slave and a master (or equivalently two circuits which are being coupled together) can operate on different voltages. This may be useful because some circuits such as processors can require higher or lower voltage than other processors that are sought to be coupled together. The circuit also may require one "read only" and another "input/output" pin, therefore, reducing the resources needed to implement the circuit functions. The present example can be useful for microprocessors that can use a software algorithm for the communications protocol, which can be economical to implement as it utilizes one input/output pin and one input only pin.

19 Claims, 7 Drawing Sheets

BI-DIRECTIONAL LEVEL SHIFTED INTERRUPT CONTROL

CROSS-REFERENCE TO RELATED APPLICATION

This application is related to co-pending U.S. patent application entitled "Bi-Directional Single Conductor Interrupt Line For Communication Bus", U.S. patent application Ser. No. 12/060,540, filed on Apr. 1, 2008, the contents of which are incorporated by reference herein.

TECHNICAL FIELD

This description relates generally to the control of linked circuits such as processing devices or the like, and more specifically, to signaling between linked devices such as processing devices.

BACKGROUND

Electronic circuits ("circuits") may be designed to meet certain desired design criteria. Circuits may be powered by various voltages, and logic circuits may be designed to have logic levels defined at differing voltages. The power supplied to the circuits, and in particular the voltage, may depend on such mundane criteria as what is available to run the circuit. However, many types of electronic circuit's performance may be enhanced by the choice of voltages used in a circuit. Also, ease of integrated circuit fabrication may lead to choices of operating voltages suitable for the fabricated circuit. Circuit types or families may include circuits having common interface characteristics such as operating voltage and logic levels. Circuit families may also have similar construction such as common utilization on MOS transistors, bipolar transistors, or the like.

These design trends have led to the development of various electronic circuit families or types, such as the exemplary circuit families of CMOS, TTL, ECL, and the like. Each of these circuit families may utilize different power supply voltages based on performance, fabrication concerns, or the like. Also, since these circuits may be used to implement digital logic functions, different voltage levels may be used to indicate or represent ones and zeros. In addition, some circuits may be designed to operate utilizing more than two logic levels.

For example, TTL circuits may operate from 5 volt power supplies to implement digital logic circuits. The 5 volt power supply may be useful in generating voltage levels representing ones and zeros that may be useful in switching the bipolar transistors that may make up a TTL circuit on and off. These circuits were very robust and not easily damaged by static electricity, but are not used much any more because once turned off, all memory in the circuit would typically be lost.

Exemplary CMOS circuits may operate from low voltage power supplies and may utilize lower voltages to implement ones and zeros to activate MOS transistors that make up circuits in this family. This family of circuits may retain their memory when turned off, but are fragile and easily damaged by static electricity. There are numerous other examples of differing types of circuits and their suitability in various applications.

A trend in modern circuit design has been the mixed use of various types of circuits, often operating from various voltages and having differing voltages to represent ones and zeros. Mixing circuit families can have the advantage of the beneficial characteristics of these differing circuits available to designers, a challenge may be to increase interoperability and compatibility between the various circuit types. An area of challenge in these designs has been providing an interface busses or connections, and circuitry to satisfactorily translate and transfer logic signals between circuits operating at various voltage levels.

SUMMARY

The following presents a simplified summary of the disclosure in order to provide a basic understanding to the reader. This summary is not an extensive overview of the disclosure, and it does not identify key/critical elements of the invention or delineate the scope of the invention. Its sole purpose is to present some concepts disclosed herein in a simplified form as a prelude to the more detailed description that is presented later.

The present example provides a circuit that provides interoperability between circuits that may be powered from differing voltages, and that may operate at differing logic levels. Isolation may be provided from the impedance provided by transistor circuits and level shifting may be provided by a divider network.

With this circuit, an exemplary slave and a master (or equivalently two circuits which are being coupled together) can operate on different voltages. This may be useful, because some circuits such as processors can require higher or lower voltages than other processors that are sought to be coupled together. The circuit also may require one "read only" and another "input/output" pin, therefore reducing the resources needed to implement the circuit functions.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
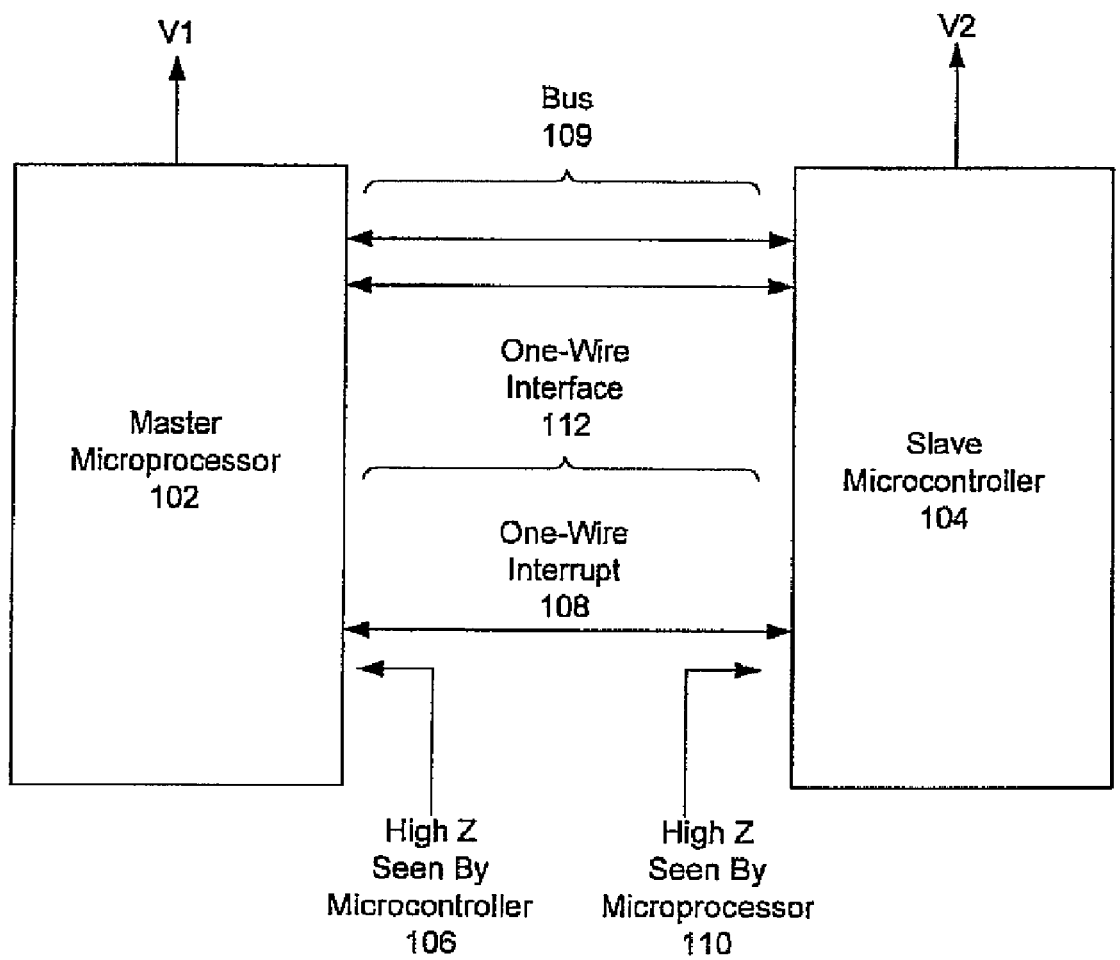
FIG. 1 is a block diagram showing processor communication parameters via a one wire interface.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The present example can be useful for microprocessors that can use a software algorithm for the communications protocol, which can be economical to implement as it utilizes one input/output pin and one input only pin. An exemplary pin out of this type can be more economical to produce than providing two input/output pins. Microprocessors with hardware protocol drivers can be more expensive, even though they are easier to implement. Also, the interrupt is typically used only to signal to the master when the slave is ready for the communications to begin and similarly in the opposite direction, but as implied, the communication channels must typically also be level shifted.

The examples below describe a bi-directional level shifted interrupt control of devices, or circuits, having differing voltages. The circuit can be bidirectional on the same wire (a "one-wire interface" or equivalently a "bidirectional single conductor interrupt line"). The examples provided below may be provided as a discrete circuit, a stand alone integrated circuit package, as a subsystem coupled to another circuit making up an integrated circuit, or the like.

The examples below describe communications between processors. Although the present examples are described and illustrated herein as being implemented in a multi processor system, the system described is provided as an example and not a limitation. As those skilled in the art will appreciate, the present examples are suitable for application to a variety of different circuit types, in various bussed circuit systems such as Inter-Integrated circuit, SMBus, or the like.

An exemplary one wire interface can be the Inter-Integrated Circuit ("I$^2$C" or "I2C") bus, which can be a multi-master serial computer bus, typically used to attach low-speed peripherals to a motherboard, embedded system, cell phone or the like. Typically, I$^2$C uses two bidirectional open-drain lines, Serial Data (SDA) and Serial Clock (SCL), pulled up with resistors. Typical voltages used may be +5 V or +3.3 V, although higher or lower voltages may be equivalently utilized. An I2C data bus may be used in data exchange transactions between processors.

There are several things to note regarding operation of the examples below in conjunction with the exemplary one wire interfaces. First, it is worth noting that the examples below apply to slave microcontrollers that can require a software process to implement the standard protocol (like I2C). To implement the I2C hardware in the software rather than in hardware, can make the microcontroller a more economical component. With protocol hardware (like I2C), the microcontroller typically does not need an interrupt to signal a communication between master/slave. Additionally, implementing the examples described below can allow the user to implement multiple voltages for the slave. Second, the interrupt described below is typically always the same, from the slave to the master on the falling edge of the "interrupt line." The interrupt triggers the master to send an I2C (or the like) query to the slave. Third, an exemplary port designated "pin1" is always set to an input, therefore it is typically never "set" it is typically always "read" or "sensed".

In the exemplary system, a device coupled to a bus may operate in four potential modes, although most devices typically maintain a single role (master or slave) and either transmit or receive in fulfilling that role. The master may transmit data to a slave, or receive data from a slave. The slave may transmit data to the master, or receive data from a master. When the slave is being addressed (typically through its device address), it can send an acknowledgment signal or bit to indicate that it is ready to receive or transmit data. A one wire interrupt can be used by a master to interrupt a slave processor, and signal back to the master that the slave is ready to receive an I2C data transaction. A one wire interrupt must be used by the master when addressing a slave that is implementing the exemplary I2C (or the like), within a software process rather than a hardware state machine.

FIG. 1 is a block diagram of processor communication parameters via a one wire interface 112 that may be used in I2C data exchange. Such communications can be used for example, when a microprocessor 102 wishes to talk to another microcontroller 104 when coupled via a one-wire interrupt 108. As shown, two integrated circuits, here, exemplary processors 102, 104, are coupled by a one wire interface 112. Pulling a line to ground is considered a logical zero while letting the line float, can be considered a logical one. The line should always be "pulled" one way or another. It is worth noting, the relative impedances of master/slave at the time of interrupt. The default state of the interrupt line is in "pull-down" mode.

When using the one-wire interrupt, if a designated master device wishes to interrupt the device designated as a slave, the master simply pulls-up (resistively) on the control line, and waits until the slave has pulled down on this line, thus prompting the master that the slave is ready to receive an I2C transaction. However, the one wire interface 112 will typically only work for devices communicating on the same power supply (same voltage rail or V1=V2). The examples below provide a circuit called a bi-directional level shifted interrupt for one-wire interfaces, that can be used to provide level shifting and high impedance inputs that may be needed to make the one wire interface work for multi-supply circuits or devices.

Both microcontrollers 102, 104 can be on different power supplies V1, V2 (voltage). With the one-wire interrupt approach, both systems need to have high impedance relative to each-other 106, 110, so that they can signal back and forth without bus collisions.

As mentioned above, the I2C bus is a two conductor bus. The active conductors are bidirectional and include a serial data line (SDA) and a serial clock line (SCL). Depending on the functionality of a particular device connected to the bus (not shown), the device may act as a transmitter and/or receiver. Prior to any transaction on the bus, a start condition must usually be issued on the bus to indicate to typically all devices connected on the bus that a transmission is due to occur. As a result, substantially all connected devices listen to the bus after detecting the start condition. Since the I2C bus is a multi-master bus, more than one connected master device is capable of initiating a data transfer. No slave processors, however, can initiate transactions through the bus and must utilize the interrupt line to initiate transactions. Accordingly, the slave processor initiates and detects bus transactions using the interrupt line.

The processor designated as the slave processor 104, requests a transaction on the bus 109 by toggling the one wire interrupt line 108 voltage from the idle state voltage, to the service request voltage, back to the idle state voltage. After the master 102 detects the service request voltage to idle voltage transition, indicating a readiness of the slave 104, the master 102 initiates a transaction on the bus 109. Before the end of the transaction on the bus 109, the slave 104 typically releases the one wire interrupt line 108, and the master 102 also maintains the one wire interrupt line 108 at the idle voltage through a conventional pull up resistor (not shown), if no further service requests are pending. The master processor 102 initiates a transaction on the bus 109 by setting the one wire interrupt line 108 voltage to the service request voltage. After the slave processor 104 detects the service request voltage on the one wire interrupt line 108 and is prepared to receive signals on the bus 109, the slave processor 104 sets the one wire interrupt line 108 voltage back to the idle state voltage. The master processor 102 begins transmitting on the bus 109, after detecting that the one wire interrupt line 108 voltage has returned to the idle state voltage. Before the end of the transaction on the bus 109, the slave 104 typically must release the one wire interrupt line 108, and the master 102 must also maintain the one wire interrupt line at the idle voltage through a conventional pull up resistor (not shown) if no further service requests are pending.

The two conductor bus 109 transactions include information indicating whether data is to be passed from the master 102 to the slave 104, or from the slave 104 to the master 102, where the direction of data flow being is set by the master 102 device. If the slave processor 104 initiates a slave service request, and the master processor 102 interrupts the request by initiating a master service request before the slave processor 104 has returned the one wire interrupt 108 line voltage to the idle state, the transition from the service request voltage to the idle state voltage is interpreted by the master processor 102 as an acknowledgment by the slave processor 104 to the master service request. Since the master processor 102 sends information related to the master processor task, the slave processor 104 processes the master processor task and initiates another slave service request. If there is contention on the bus this may also be addressed in the one wire interrupt transactions as described next.

If the master processor 102 initiates a master service request, and the slave processor 104 attempts a slave processor service request before acknowledging the master service request, the slave processor 104 interprets a persistence of the single wire interrupt line 108 voltage at the service request voltage after the transaction is complete as the master 102 waiting for service. During such a scenario, the master processor 102 sets the one wire interrupt line 108 voltage to the service request voltage before the slave processor 104 sets the one wire interrupt line 108 voltage to the service request voltage and the slave processor 104 sets the one wire interrupt line 108 voltage to the idle state voltage, before releasing the one wire interrupt line 108. Since the slave processor 104 detects the one wire interrupt line 108, voltage remaining at the service request message level, the slave processor 104 acknowledges the master service request after slave service request is processed and the master processor data is exchanged on the bus.

The one wire interface as utilized by the present examples, is further described in "Bi-Directional Single Conductor Interrupt Line For Communication Bus", U.S. patent application Ser. No. 12/060,540, filed Apr. 1, 2008, the contents of which are incorporated herein by reference.

Figure 2:
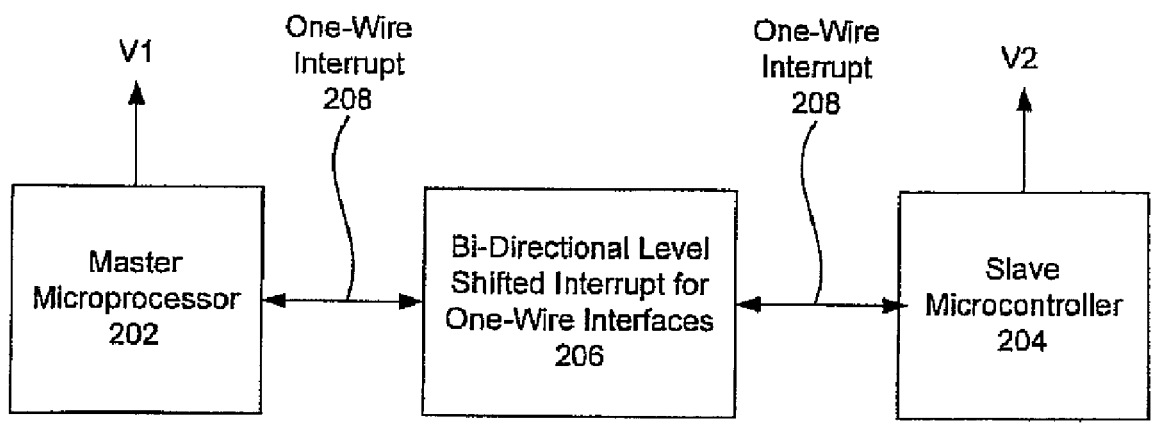
FIG. 2 is a block diagram of processor communication via a one wire interface that is provided by a bi-directional level shifted interrupt.

FIG. 2 is a block diagram of processor communication via a one wire interface that is provided by a bi-directional level shifted interrupt. Microprocessor 202 is coupled to microcontroller 204 by a one wire interrupt 208, via a bidirectional level shifted interrupt for one-wire interfaces 206. A microprocessor 202 has a supply voltage V1. The microprocessor 202 is coupled to bidirectional level shifted interrupt for one-wire interfaces 206 through the one-wire interrupt 208. The bidirectional level shifted interrupt for one-wire interfaces 206 is coupled to a microcontroller 204 by the one-wire interrupt 208. Microcontroller 204 is powered from supply voltage V2.

Figure 3:
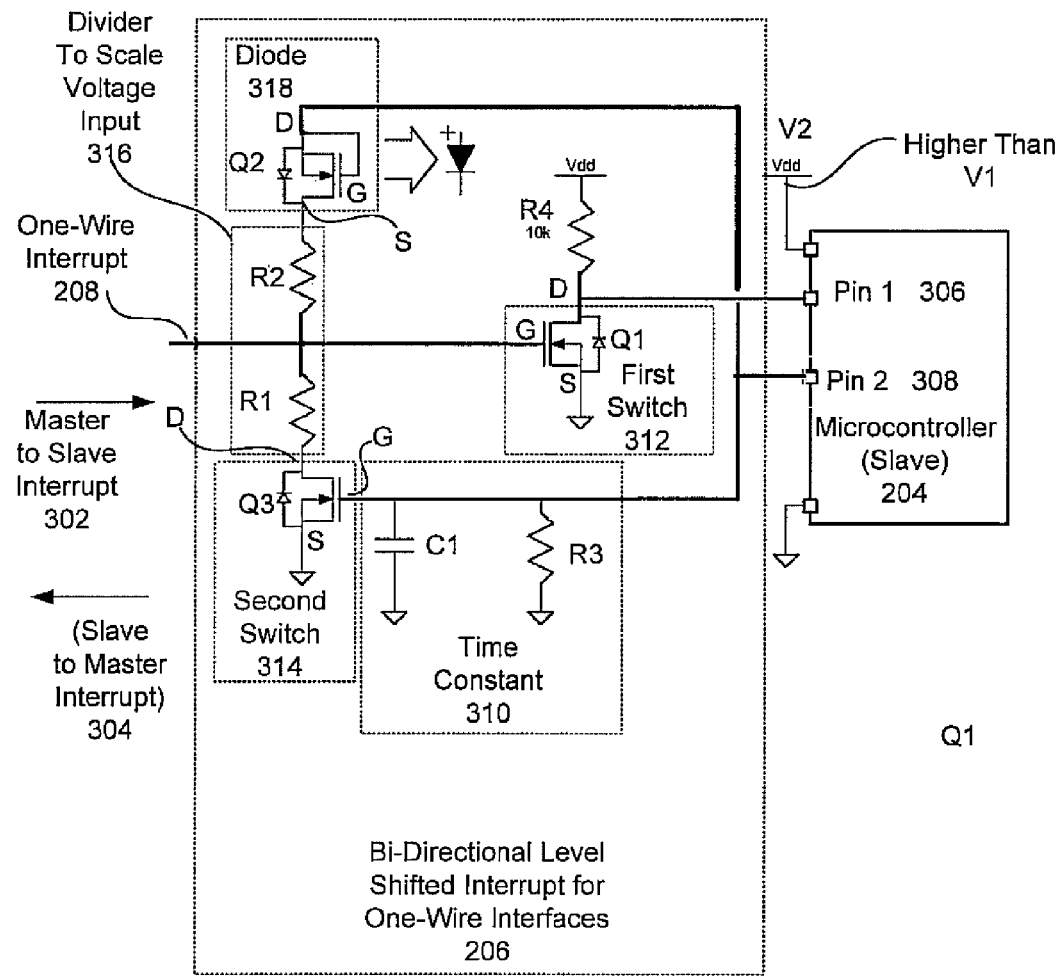
FIG. 3 is a circuit diagram showing a bi directional level shifted interrupt circuit for a one wire interface providing a master to slave interrupt or a slave to master interrupt.

FIG. 3 is a circuit diagram showing a bi-directional level shifted interrupt circuit for a one wire interface 206, providing a master to slave interrupt 302 or a slave to master interrupt 304. In the diagram, transistors Q1 and Q3 may be operated as switches 312 and 314, respectively. In other words, with application of a logic high to the gate of the transistor, the drain is coupled to the source with negligible resistance. With application of a logic low to the gate of the transistor, the drain is effectively decoupled from the source of the transistor by an acceptably high resistance, if FETs are used as switches, drain and source connections may be interchanged in the description below, as FET devices are typically symmetrical with respect to the resistive channel formed between the source and drain connections.

Transistor Q2 is configured as a diode 318, and may be equivalently replaced by a conventional diode by coupling the gate to the source. Resistors R1 and R2 form a conventional voltage divider 316. Also, the system with greater voltage cannot transmit a raw '1' at its operating voltage, for this reason, the voltage divider 316 is provided on the slave to master interrupt source. And a time constant 310 may be produced by a time constant generation circuit including capacitor C1 and R3, or their equivalent. Those skilled in the art may realize that a pin of an integrated circuit, may be equivalently referred to as a port, terminal, or the like.

A one wire interrupt 208 is coupled to first terminals of resistors R1, R2, and gate ("G") of transistor Q1. The drain of Q1 is coupled to a first terminal of a resistor R4 and pin 1, 306 of a slave microcontroller 204. A second terminal of resistor R4 is coupled to a power supply voltage Vdd=V2.

A second terminal of R2 is coupled to the source ("S") of diode configured transistor Q2. The gate ("G") and drain ("D") of transistor Q2 are coupled in common and to pin 2, 308 of slave microcontroller 204.

A second terminal of resistor R1 is coupled to the drain ("D") of transistor Q3. The source ("S") of transistor Q3 is coupled to a ground or common connection. A gate ("G") of transistor Q3 is coupled to first terminals of resistor R3 and capacitor C1, and also to pin 2, 308 of the microcontroller 204. Second terminals of resistor R3 and capacitor C1 are coupled to ground.

Resistors R1, R2, R3 and R4 are conventionally constructed. Transistors Q1-Q3 can be conventionally constructed switching transistors, which may be MOSFETs or their equivalent. Transistor Q2 is configured as a diode, as that type of configuration can be suitable for integrated circuit applications. However, a conventional diode may be equivalently substituted. Resistor R3 is shown having a value of 10 kilo-Ohms. However, any suitable value for a pull up/pull down resistor may be utilized. Capacitor C1 and resistor R3 can be selected to set a time constant as explained below. Microcontroller 204 is conventionally constructed, and is coupled to power supply voltage Vdd.

There can be two directions of signal flow, from master to slave and from slave to master. Assume for now that the microcontroller 204 in the diagram is the slave and that that the slave voltage V2 is higher than that of the master voltage (not shown). When the master wants to interrupt the slave 204, the master asserts a pull-up resistor on the interrupt line 208, thus, pulling the line through a weak resistor up to the master's supply voltage (we will call this Vss). Because both Q3 and Q2 are off, they provide a very high impedance (on order of Mega-ohms), and so does the gate of transistor Q1. Thus, even though the master asserts a weak resistor, it will still overcome the large impedance of the transistors Q1-Q3.

When the gate of Q1 goes to logic high, it turns on and grounds the "pin 1" line going to the microcontroller 204. When the microcontroller 204 senses that this line has been grounded (typically through a switch SW), it will then assert the "pin 2" I/O as a digital logic high, charging up the capacitor C1, turning on transistor Q3 and forward biasing the body diode of Q2. Thus, a voltage divider is formed between the forward voltage of Q2, and R2 and R1. Depending upon the voltage of the master, R2 and R1 can be sized appropriately so that the voltage will not exceed the tolerable voltage for the master input. Also, R2 and R1 typically must be at least one order of magnitude less resistance value than the weak pull up from the master. Once the slave has asserted this signal, the bus will typically still maintain the original voltage level with which the master has already pulled to.

When the slave 204 is ready to communicate (utilizing any suitable conventional protocol), it should set the control line (pin 2) to an input state, which will assert the interrupt line to a digital low according to the one wire interface protocol. In order to do this, the capacitor C1 and resistor R3 establish a time constant that will hold the gate of Q3 logic high, while no longer forward biasing the body diode of Q2. Thus, a new voltage divider is formed between the weak pull-up in the master, and the much stronger pull down R1. When this happens, the interrupt line will be asserted low, signaling to the master that data can be transmitted.

For signaling from slave to master, the later half of same process can be followed. The only difference is that signaling from slave to master typically does not include an intrinsic "delay" for when slave recognizes (in software) the interrupt from master through Q1. Since the bus is in a high impedance state in idle mode (weak pull down from master), the slave microcontroller can assert the line whenever it chooses by simply following the same process.

Figure 4:
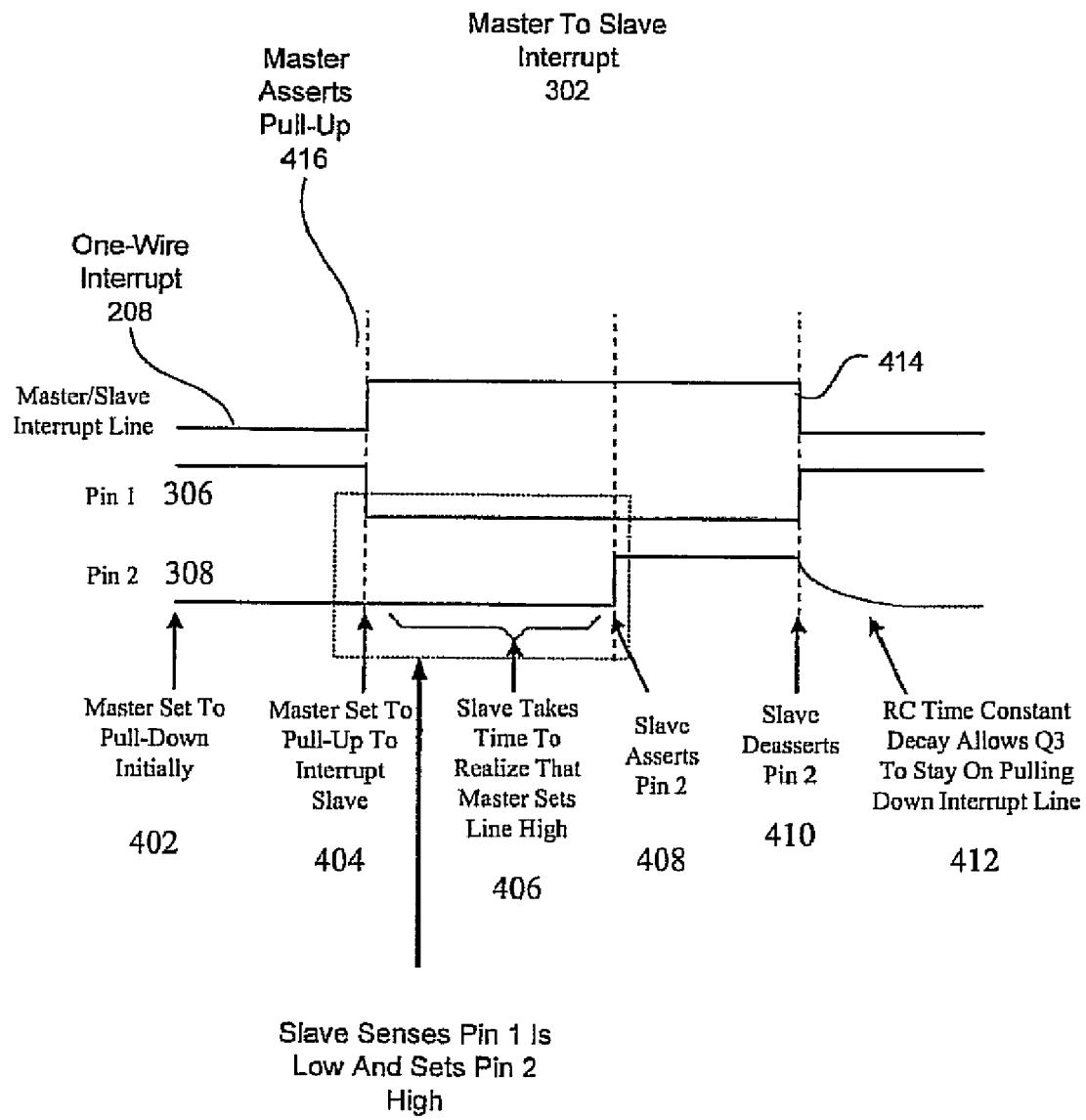
FIG. 4 is a timing diagram showing circuit conditions during a master to slave interrupt.

FIG. 4 is a timing diagram showing circuit conditions during a master to slave interrupt (302 of FIG. 4). Initially, the one wire interrupt line 208 is set low, Pin 1 306 is sensed high and pin 2 308 is set low. On the master slave interrupt line, the master asserts a pull up 416 causing the signal to go high. A high on this line turns on transistor switch 312 causing a logic zero to be applied to pin 1 as shown at 404 of the timing diagram. There can be a time lag until the slave senses that pin 1 has gone low, due to software implementation of the communication protocol 406. Once the slave realizes that pin 1 has gone low, the slave IC can cause pin 2 to go to a logic 1 408. The slave remains high until desired and then pin 2 goes to a low. However, the time constant 412 of the RC network (310 of FIG. 3) prevents the voltage from dropping to zero immediately 410. The delay prevents the transistor switch (314 of FIG. 3) from turning off immediately, but does stop current flow through the diode (318 of FIG. 3)

The sequence of events shown apply when the falling edge of the interrupt line 414 is a true hardware interrupt for the master. A true hardware interrupt typically occurs when the master is aware that the slave has acknowledged the request for data.

Figure 5:
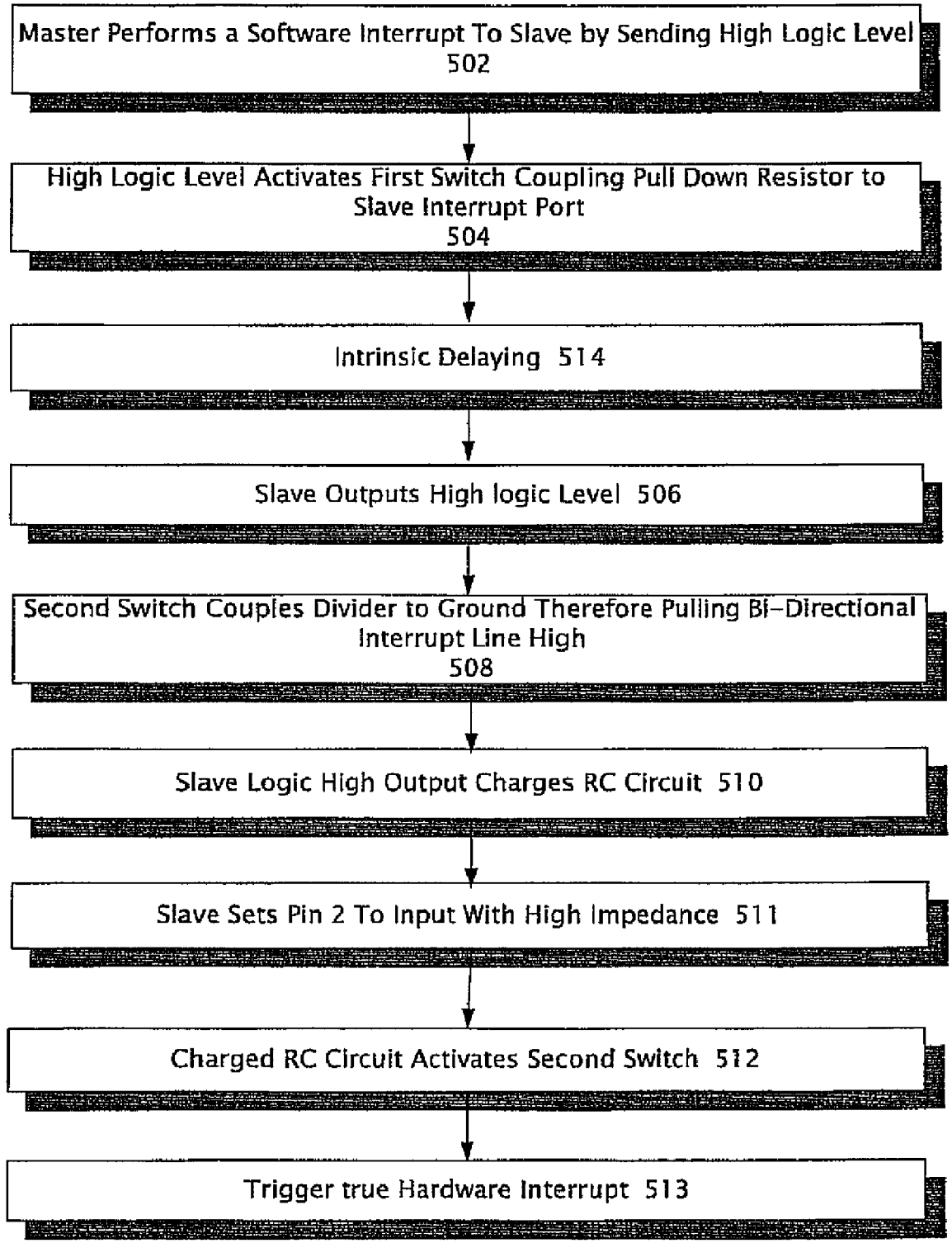
FIG. 5 is a process flow diagram showing a master to slave interrupt sequence.

FIG. 5 is a process flow diagram showing a master to slave interrupt sequence (302 of FIG. 4). First, a master performs a software interrupt of the slave by sending a high-logic level signal to the slave 502. The high-logic level activates a first switch which couples a pull down resistor to the slave input port 504. The switch typically grounds one end of the pull down resistor that has the slave interrupt port coupled to it so that the input port may see a logic zero. Next, an intrinsic delay 514 occurs, which is due to the software architecture of the bus, in which a finite period of time is expended before the slave realizes that the master has coupled pin 1 to a high-logic level. The delay 514 is not a purposeful delay, it is intrinsic to the nature of the slave device. Since the communication is not provided by hardware logic states, but by a software process, it can take one or more processor cycles to recognize the master's request.

Next, the slave outputs a high-logic level 506. The high-logic level activates a second switch, coupling a divider circuit to ground, pulling the bidirectional input line high 508. The slave logic high output changes state going to a low, during which time an RC circuit discharges 510. At 511, the slave sets pin 2 to an input with high impedance. The charged RC circuit continues to activate the second switch until it's charged to case to sufficient voltage level to release the switch 512. At block 512, the charged RC circuit keeps the second switch 'ON' while the diode (318 of FIG. 3) can no longer sustain a forward bias due to a lack of drive from pin 2 and therefore, pulls the bidirectional line low through the low impedance (relative to the master pull up impedance) of resistor R1 (of FIG. 3). At 513, a hardware interrupt can be triggered within the master, once the bi-directional line is pulled low. The master can then initiate a communications channel through another exemplary bus, such as I2C, SPI or the like.

Figure 6:
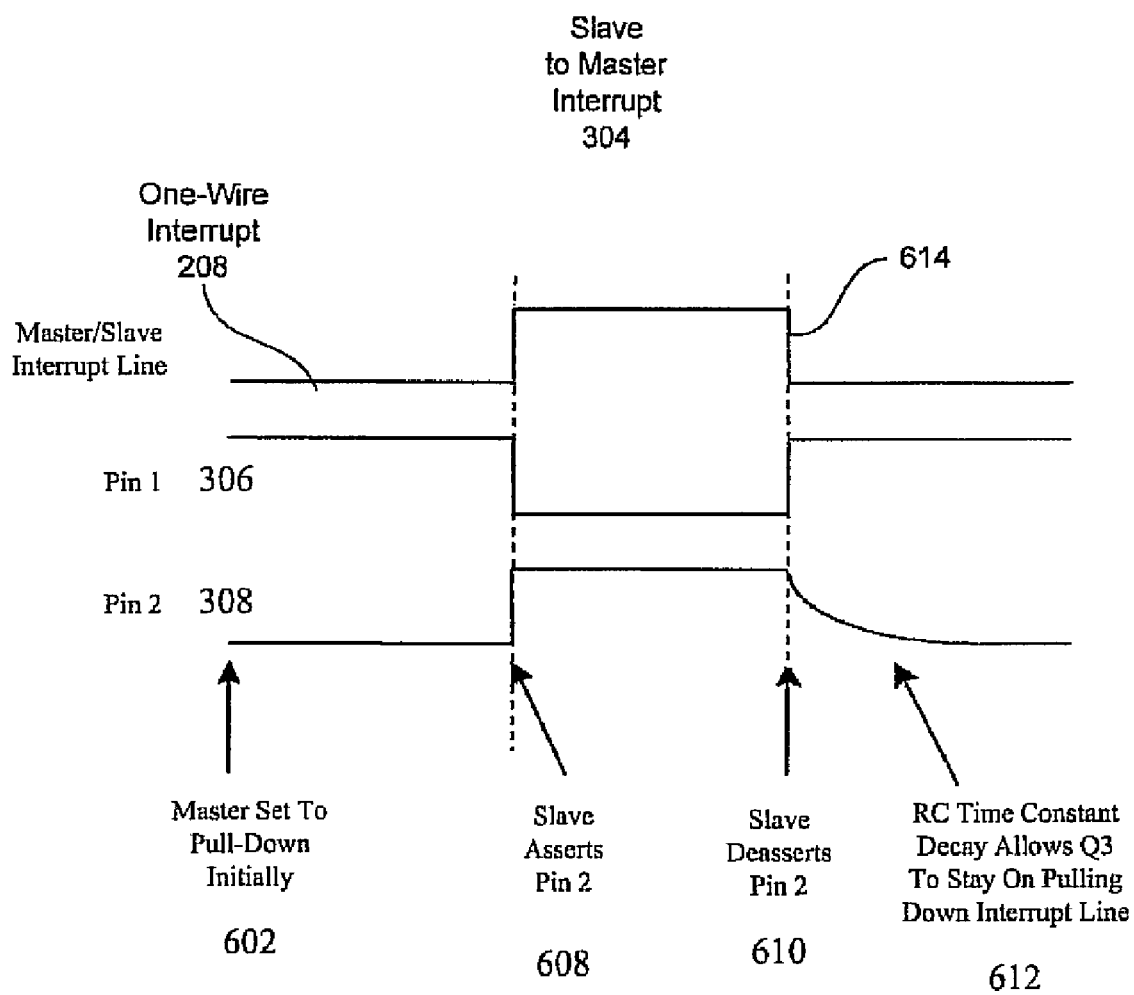
FIG. 6 is a timing diagram showing circuit conditions during a slave to master interrupt.

FIG. 6 is a timing diagram showing circuit conditions during a slave to master interrupt (304 of FIG. 6). Initially, the one wire interrupt line 208 is set low, Pin 1 306 is sensed high, pin 2 308 is set low, and this master is initially set to pull down 602. With the master initially set to pull down 601, the Slave asserts a pull up 608 causing the signal at pin 2 to go high. A high on this line turns on transistor switch 612, causing a logic zero to be applied to pin 1 as shown on the timing diagram. Once the slave realizes that pin 1 has gone low, the slave IC can cause pin 2 to go to a logic 1 608. The slave remains high until it is ready to accept the master's transaction through the alternative protocol and then pin 2 goes to a low. However, the time constant of the RC network (310 of FIG. 3), prevents the voltage from dropping to zero immediately 610. The delay prevents the transistor switch (314 of FIG. 3) from turning off immediately.

The sequence of events shown apply when the falling edge of the interrupt line 614 is a true hardware interrupt for the master. A true hardware interrupt typically occurs when the master is aware that the slave has acknowledged the request for data.

Figure 7:
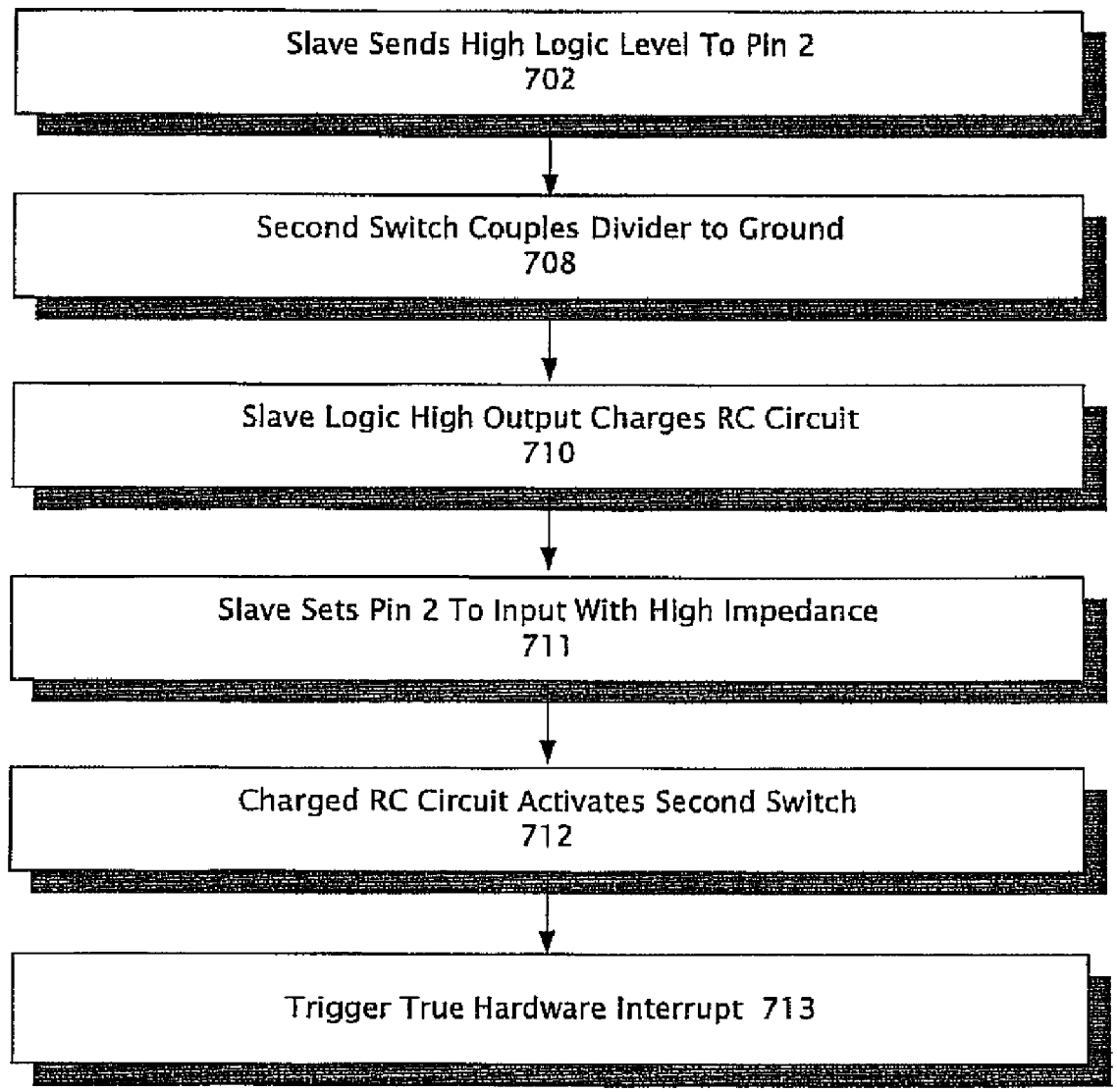
FIG. 7 is a process flow diagram showing a slave to master interrupt sequence.

FIG. 7 is a process flow diagram showing a slave to master interrupt sequence (304 of FIG. 6). First a slave sends a high-logic level signal on pin 2, 702. The high-logic level activates a second switch, coupling a divider circuit to ground 708. The slave logic high output changes state going to a low during which time an RC circuit discharges 710. At 711, the slave sets pin 2 to an input with high impedance.

The charged RC circuit continues to activate the second switch until it's charged, to case to sufficient voltage level to release the switch 712. At block 712, the charged RC circuit keeps the second switch 'ON' while the diode (318 of FIG. 3) can no longer sustain a forward bias due to a lack of drive from pin 2 and therefore, pulls the bidirectional line low through the low impedance (relative to the master pull up impedance) of resistor R1 (of FIG. 3). At 713, a hardware interrupt can be triggered within the master, once the bi-directional line is pulled low. The master can then initiate a communications channel through another exemplary bus, such as I2C, SPI or the like Those skilled in the art will realize that the process sequences described above may be equivalently performed in any order to achieve a desired result. Also, sub-processes may typically be omitted as desired without taking away from the overall functionality of the processes described above.

Those skilled in the art will realize that the circuits described above may be implemented in a variety of configurations, such as discrete circuits, integrated circuits, DSPs, and the like.

What is claimed is:

1. A bi-directional level shifted interrupt circuit comprising:
a first switch controlled by a one wire interrupt line for coupling a resistor coupled to a first port of a first integrated circuit to ground;
a second switch controlled by a second port of the first integrated circuit for coupling a first terminal of a divider to ground; in which the divider includes a first resistor and a second resistor coupled in series at a first terminal of the first resistor and a first terminal of the second resistor, in which the second terminal of the first resistor is coupled to the second port of the first integrated circuit, and in which the second terminal of the first resistor is coupled to the second port of the first integrated circuit through a diode.

2. The bi-directional level shifted interrupt circuit of claim 1 in which the first terminal of the first resistor is also coupled to the one wire interrupt.

3. The bi-directional level shifted interrupt circuit of claim 1 in which the first switch is a FET having a gate coupled to the one wire interrupt line, a source coupled to ground and a drain coupled to the first port of the integrated circuit.

4. The bi-directional level shifted interrupt circuit of claim 1 in which the second terminal of the second resistor is coupled to an input port of the second switch.

5. The bi-directional level shifted interrupt circuit of claim 4 in which the second switch is a transistor switch.

6. The bi-directional level shifted interrupt circuit of claim 5 in which the transistor switch is a FET.

7. The bi-directional level shifted interrupt circuit of claim 6 in which the FET includes a source coupled to ground, a drain coupled to the second terminal of the second resistor and the gate is coupled to the second port of the first integrated circuit.

8. The bi-directional level shifted interrupt circuit of claim 1 further comprising a time constant generation circuit coupled to the second port of the first integrated circuit.

9. The bi-directional level shifted interrupt circuit of claim 8 in which the time constant generation circuit is an RC circuit.

10. The bi-directional level shifted interrupt circuit of claim 1 in which the first integrated circuit is a slave circuit.

11. The bi-directional level shifted interrupt circuit of claim 1 further comprising a second integrated circuit coupled to the one wire interrupt.

12. The bi-directional level shifted interrupt circuit of claim 11 in which the second integrated circuit is a master circuit.

13. The bi-directional level shifted interrupt circuit of claim 12 in which the master circuit communicates with the slave circuit by coupling to the slave through an I2C bus.

14. A bi-directional level shifted interrupt circuit comprising:
a first switch controlled by a one wire interrupt line for coupling a resistor coupled to a first port of a first integrated circuit to ground;
a second switch controlled by a second port of the first integrated circuit for coupling a first terminal of a divider to ground;
a diode having a first diode terminal coupled to a second terminal of the divider, and a second diode terminal coupled to the second port of the first integrated circuit; and
a second integrated circuit coupled to the one wire interrupt in which the second integrated circuit is a master circuit; in which the master circuit is powered by a voltage differing from a voltage powering a slave circuit.

15. A process for interrupting communications between a master and a slave comprising:
sending a logic high level to the slave;
activating a switch coupling a pull-down resistor to a slave interrupt port;
outputting a high logic level from the slave;
coupling a divider to ground;
charging a time constant generation circuit; and
maintaining coupling of the divider to ground until a time constant of the time constant generation circuit decays.

16. A bi-directional level shifted interrupt circuit comprising:
a first switch controlled by a one wire interrupt line for coupling a resistor coupled to a first port of a first integrated circuit to ground;
a second switch controlled by a second port of the first integrated circuit for coupling a first terminal of a divider to ground; and
a two terminal diode having a first diode cathode terminal coupled to a second terminal of the divider, and a second diode anode terminal coupled to the second port of the first integrated circuit.

17. The bi-directional level shifted interrupt circuit of claim 16 in which the divider includes a first resistor and a second resistor coupled in series at a first terminal of the first resistor and a first terminal of the second resistor.

18. The bi-directional level shifted interrupt circuit of claim 16 in which the first switch is a FET having a gate coupled to the one wire interrupt line, a source coupled to ground and a drain coupled to the first port of the integrated circuit.

19. The bi-directional level shifted interrupt circuit of claim 16 further comprising a time constant generation circuit coupled to the second port of the first integrated circuit.

* * * * *